United States Patent [19]

Nash et al.

[11] 4,388,730

[45] Jun. 14, 1983

[54] NOISE DETECTOR AND DATA SIGNAL RECEIVER FOR A FREQUENCY MODULATION SYSTEM

[75] Inventors: Donald H. Nash, Colts Neck; Duen H. Yen, Shrewsbury, both of N.J.

[73] Assignee: Bell Telephone Laboratories, Incorporated, Murray Hill, N.J.

[21] Appl. No.: 251,320

[22] Filed: Apr. 6, 1981

[51] Int. Cl.³ .......................... H04B 1/10; H04B 1/16
[52] U.S. Cl. ..................................... 455/208; 375/81; 455/212; 455/214; 455/222; 455/225
[58] Field of Search ............... 375/5, 81, 88; 455/208, 455/209, 212, 213, 214, 218, 222, 225, 260, 265, 615, 614, 617, 42; 329/112, 122

[56] References Cited

U.S. PATENT DOCUMENTS

| | | | |
|---|---|---|---|
| 2,501,416 | 3/1950 | Smith | 455/213 |
| 3,783,387 | 1/1974 | Wernli | 455/212 |
| 4,093,824 | 6/1978 | Grosjean | 455/212 |
| 4,167,705 | 9/1979 | Martin | 455/218 |
| 4,228,320 | 10/1980 | Celli et al. | 455/212 |
| 4,229,822 | 10/1980 | Bench | 375/81 |

FOREIGN PATENT DOCUMENTS 1553852  3/1976  United Kingdom .
1560264  8/1977  United Kingdom .

OTHER PUBLICATIONS

Phaselock Techniques–F. M. Gardner, 1966, John Wiley & Sons, pp. 52–54, (Tracking and Acquisition).
XR–2211 FSK Demodulator/Tone Detector–Exar Corp. Technical Data Sheets–Oct. 1976, pp. 29–34, (FIG. 3).

*Primary Examiner*—Marc E. Bookbinder
*Attorney, Agent, or Firm*—T. H. Jackson

[57] ABSTRACT

A noise detector and data signal receiver for a frequency modulation system has a first phaselock loop circuit (300), responsive to the received signal, for providing a signal indicative of the noise level and a first stage of demodulation of the received signal. A high speed comparator (330) of the first phaselock loop circuit provides a 90 degree phase-shifted signal which exhibits lesser delay and is substantially in phase with the input. Accordingly, the noise detection capability of the phaselock loop circuit (300) is improved. A second phaselock loop (200), also responsive to the received signal, extracts a voice signal from the received signal. A third phaselock loop (400) responsive to the once demodulated output signal of the first phaselock loop (300), extracts a digital data signal from the received signal. Squelch circuits (120, 121), activated at separate particular levels of noise, are responsive to the noise level indicator signal of the first phaselock loop. In addition, a noise proportional signal is provided to a speaker for providing the user of a hands-free telephone system of which the present receiver comprises a component with an audible feedback of the noise.

13 Claims, 5 Drawing Figures

NOISE DETECTOR AND DATA SIGNAL RECEIVER FOR A FREQUENCY MODULATION SYSTEM

BACKGROUND OF THE INVENTION

1. Technical Field

This invention relates to frequency modulation systems for transmitting voice and data signals and, more particularly, to the detection of noise in such systems.

2. Description of the Prior Art

It is often desirable to have available an indication of the noise content of a signal received through a particular transmission system. In certain forms of transmission systems, the transmission medium changes so rapidly and over such extremes that a constant running indication of noise level is necessary for the proper operation of the system. Such systems include light wave frequency transmission systems, particularly when the transmitter and receiver are movable with respect to one another. When such systems are used for the transmission of voice signals, it has been found desirable to provide a squelch circuit, responsive to an undesirable noise level, for greatly attenuating or squelching the voice signal.

In a hands-free telephone station system in which it is contemplated that the transmitter be portable and carried about with the user as the user moves about the room, the transmission path varies considerably during normal usage. Moreover, if transmission frequencies in the light wave frequency range are utilized to improve the privacy of such a system, the path length of the transmission link does indeed vary considerably. In such systems, instantaneous and continuous noise detection and suppression are essential.

Techniques for deriving a signal indicating the noise level of a received signal are generally discussed in F. M. Gardner's textbook, "Phaselock Techniques." In practice, Celli et al., U.S. Pat. No. 4,228,320, teaches that a phaselock loop circuit comprising an exclusive OR gate provides such an indicator signal in the receiver of their hands-free telephone station system.

A problem, however, has been uncovered in the application of the teachings of Celli et al. The two divide-by-two circuits, employed to provide an in-phase signal of the same frequency for comparison with the received signal, induce an undesirable delay. In conventional operation, the output generated by a voltage-controlled oscillator of the phaselock loop is 90 degrees out-of-phase and ahead of the received signal. The two divide-by-two circuits, while acting to provide the desired in-phase relationship with the received signal, in fact induce delay in the locally generated signal which exhibits itself as a source of undesirable noise. Accordingly, the Celli phaselock loop is unable to detect sufficiently low levels of received signal noise.

Also, in the practice of the Celli hands-free telephone station system, a need was recognized to provide alternate voice or data capabilities. The portable transmitter disclosed in Celli et al. has no capability to remotely request dial tone or dial another telephone. Assuming the receiver may comprise a CRT computer terminal, the Celli transmitter has no capability to manipulate characters on the CRT display screen.

SUMMARY OF THE INVENTION

The above-stated problems and related problems of the prior art are solved with the principles of the present invention, a noise detector and signal receiver for a frequency modulation system. The noise indicating phaselock loop circuit of the present invention comprises a high speed comparator amplifier, connected across the timing capacitor of the voltage controlled oscillator, for providing the 90 degree phase-shifted, locally generated signal. In this manner, the amount of delay associated with the locally generated signal is significantly reduced. As a result, the noise detection quality of the present phaselock loop is improved, the present phaselock loop detecting lower levels of received signal noise.

In addition, the principles of the present invention permit the reception of a data signal over the same transmission medium as the transmitted voice signal, the data signal having the capability to remotely operate a CRT computer terminal. In accordance with these principles, the same phaselock loop circuit which provides an indicator signal representative of the noise level of the received signal also provides a once demodulated digital data signal. Accordingly, two modes of operation are provided: a voice and a data mode.

It is assumed in the present invention that the digital data signal is one that has been first modulated above the voice signal and then summed with the voice signal. The combined signal is then frequency modulated at a particular carrier frequency. Accordingly two more phaselock loops are provided in the present invention. A second phaselock loop is used in the present invention to extract the voice signal from the received signal. A third phaselock loop extracts the digital data signal from the once demodulated output of the first phaselock loop.

A transmitter which may be used with the present invention for alternately transmitting voice and data signals modulated above the voice signal over a frequency modulated infrared light medium is disclosed in application Ser. No. 251,258 filed Apr. 6, 1981 by G. Lese and D. H. Nash entitled, "A Frequency Modulation Transmitter for Voice or Data."

Once the noise level indicator signal is derived at the output of the first phaselock loop circuit of the present invention, it may be applied in either the voice mode of operation or the data mode to operate squelch circuits responsive to particular levels of received noise. The squelch circuits, responsive to the selected levels of received noise, greatly attenuate or squelch the voice or data signals respectively.

It is known that different kinds of received noise affect the reception of a voice signal differently from the reception of a data signal. For example, the noise influence on a voice signal is subjectively ascertained by the qualitative evaluation of a group of listeners while the noise influence on a data signal is probabilistically ascertained by the number of errors in the received digital data signal. Thus, the present invention teaches that the particular noise level for operation of the voice squelching circuit may not be the same level chosen for operation of the data squelching circuit.

If the present invention is used in a hands-free telephone station system, the noise level indicator signal output of the first phaselock loop activates a speaker for providing an audible feedback of the noise to its user, regardless of operation mode.

DETAILED DESCRIPTION

Figure 1:
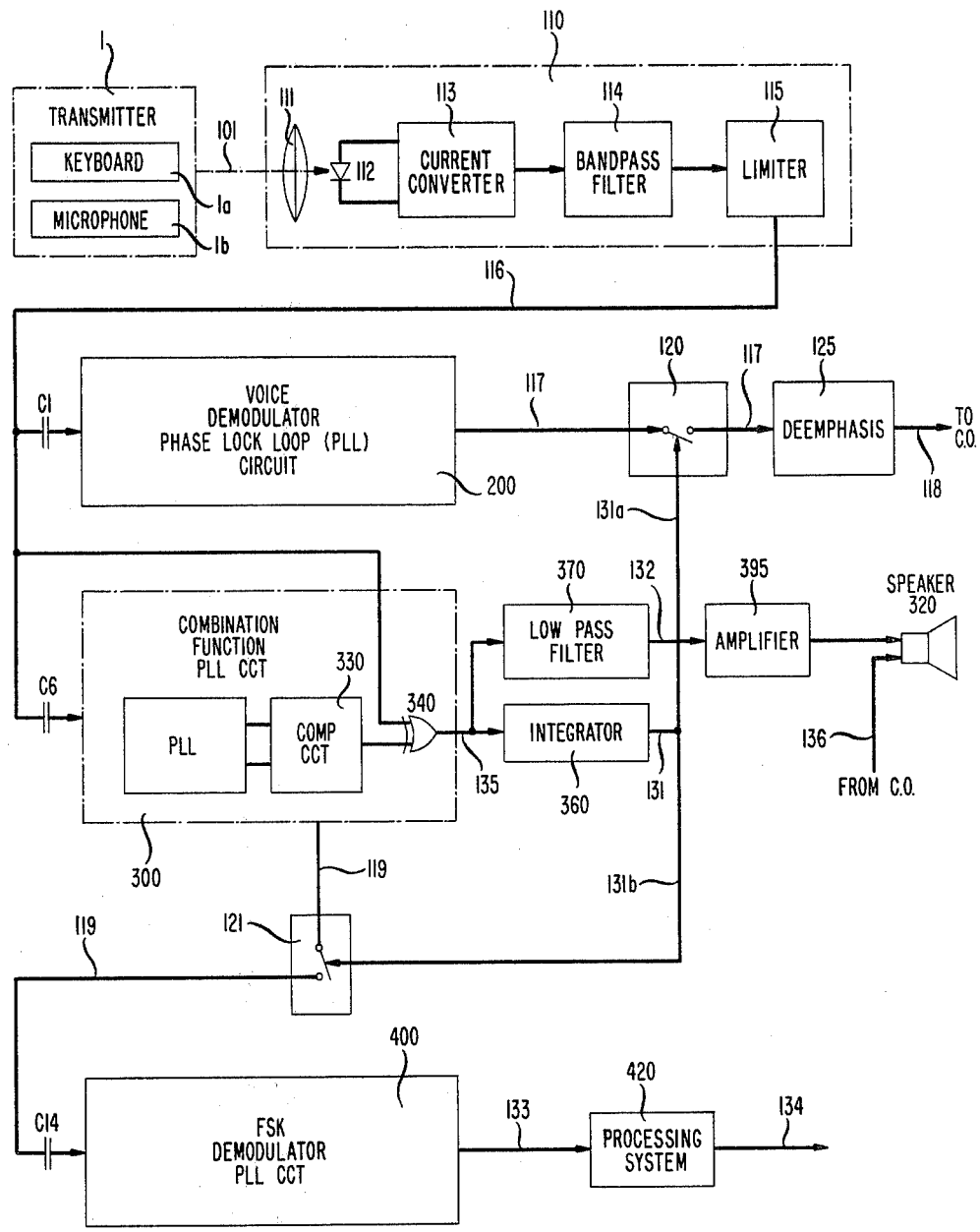
FIG. 1 is a schematic drawing and general block diagram of one embodiment of a cordless telephone station system comprising a noise detector and signal receiver in accordance with the present invention, the noise detector and signal receiver comprising three phaselock loop circuits.

Referring more particularly to FIG. 1, there is shown a general block diagram and schematic drawing of one embodiment of a cordless telephone station system which comprises the noise detector and signal receiver of the present invention. The cordless telephone station system also comprises a portable transmitter 1 for providing a frequency modulated light wave 101 to an optical receiver 110. The optical receiver provides the received frequency modulated carrier signal over output lead 116.

The portable transmitter 1 comprises remote keyboard 1a data input capability as well as remote voice input capability through microphone 1b. While the depicted transmitter provides a frequency modulated light wave output 101 to an optical receiver 110, other forms of transmission medium may be used. Such media which are known in the art include radio waves and ultrasonic waves besides the depicted light wave application.

It is additionally assumed of the transmitter 1 that it is of the type which first modulates the digital data output from keyboard 1b above the voice signal input derived from microphone 1b. The once modulated data signal is then summed with the voice signal and frequency modulated for transmission over the desired media, be it light, radio, or ultrasonic waves.

One transmitter for providing a frequency modulated infrared light wave signal which practices the previously described assumptions is disclosed in application Ser. No. 251,258 entitled, "A Frequency Modulation Transmitter for Voice or Data," filed Apr. 6, 1981, by G. Lese and D. H. Nash. Lese et al. teaches that the digital data signal derived from the keyboard 1a be frequency shift key (FSK) modulated to frequency levels just above a voice bandwidth of 0–3 kHz, for example, at 5 and 6.25 kHz. This practice of modulating the data above the voice may also be implemented through other known means for modulating data without limiting the principles of the present invention.

The choice of receiver 110 depends upon the choice of media 101. It is assumed of the depicted optical receiver 110 that it comprises a lens system 111 which may include an optical filter for focusing the received light waves 101 upon optical transducer circuit 112 which may be a PIN diode or other photodetection and transduction device known in the art. If voltage/current conversion is required, the electrical output of optical transducer circuit 112 is provided through current converter circuit 113 to bandpass filter 114. The bandpass filter circuit is selected to pass a selected band of frequencies about a particular carrier frequency.

In one particular embodiment, the carrier frequency is 120 kHz and the lightwave frequency chosen is in the infrared region. The choice of a carrier frequency at 120 kHz permits two-way operation if desired and a measure of immunity to fluorescent light noise interference. A 50 kHz bandwidth is selected in order to achieve a satisfactory signal fidelity while minimizing the power consumption of portable transmitter 1.

After passage through bandpass filter 114, the received signal is passed through a limiter circuit 115. The limited signal is then provided over output leads 116 through coupling capacitors C1 and C6 to voice demodulator phaselock loop circuit 200 and to combination function phaselock loop circuit 300 respectively. Voice demodulator phaselock loop circuit 200 extracts the voice signal from the received input signal. The voice signal output is provided over output lead 117 through squelch circuit 120 to de-emphasis circuit 125. The de-emphasized voice signal passes over output lead 118 toward a telephone central office and a called telephone subscriber.

Phaselock loop circuits 200 and 300 in accordance with well-known principles, track the frequency of their AC coupled input signals and provide a degree of noise reduction. The active tracking of the phaselock loops and the band limiting qualities of their associated loop filters combine to provide the noise reduction feature.

At the same time the received input signal is provided through coupling capacitors to phaselock loop circuits 200 and 300, it is provided directly to one input terminal of exclusive OR circuit 340 of phaselock loop circuit 300. At the output of exclusive OR circuit 340, a signal representative of the noise level of the received input signal is provided.

It is necessary in phaselock loop circuit 300 to derive a delay-free signal for comparison with the received input signal at the input to exclusive OR circuit 340. A high speed comparator amplifier circuit 330 is used for this purpose. It connects the phaselock loop of combination function phaselock loop circuit 300 to the other input terminal of the exclusive OR circuit 340. The noise indicating function of the combination function phaselock loop circuit 300 is discussed in greater detail in the subsequent discussions of FIG. 3 and FIG. 5.

The combination function phaselock loop circuit 300 also provides the first stage of demodulation of the digital data signal. The once demodulated output is provided over output lead 119 through squelch circuit 121. The once demodulated output signal is then coupled through coupling capacitor C14 to data demodulator phaselock loop circuit 400.

Data demodulator phaselock loop circuit 400 performs the final stage of demodulation of the digital data signal. The specific type of data demodulator phaselock loop chosen will depend upon the data modulation scheme chosen for the first stage of data modulation performed by the transmitter 1. The particular embodiment selected for elaboration in the subsequent discussion of FIG. 4 assumes a frequency shift key (FSK) data modulation scheme but other data modulation schemes known in the art may be employed such as phase shift keying.

The digital data signal passes over output lead 133 to processing system 420, which may direct the performance of a particular function over output lead 134 in accordance with the received data. For example, the user of portable transmitter 1 may depress a key of keyboard 1a for requesting dial tone from a central office. As a result, a command sent over output lead 134 initiates the return of dial tone over lead 136 to operate speaker 320.

Returning to a discussion of the indicator signal at the output of exclusive OR circuit 340, the indicator signal passes through integrator circuit 360 in the depicted embodiment in order to establish a second indicator signal representative of the noise level of the received input signal. The non-integrated input and the integrated output signals of the integrator circuit 360 are more particularly described in the subsequent discussions of FIG. 3 and FIG. 5. Yet, it is important at this point to emphasize that both signals are indicative of the noise level and that an appropriate choice of squelch circuits 120 and 121 responsive to a non-integrated input signal would obviate the requirement for integrator circuit 360.

In the depicted embodiment, squelch circuits 120 and 121 operate responsive to an integrated signal on leads 131a and 131b respectively. The squelch circuits may therefore be chosen to operate responsive to either an integrated or a non-integrated signal. Separate squelch circuits, however, are required for voice and data because the indicated levels of noise to which the squelch circuits are responsive should be different.

The function which the squelch circuits perform is to highly attenuate or squelch the output levels of voice and data respectively when a particular undesirable level of noise is reached. It is known in the art, especially in the application of a portable transmitter 1 that such functions are desirable. A user may rely upon a transmission path comprising reflected light or accidently break the light path in some way greatly increasing the noise level. As a result, no data or voice signals should be allowed to be misinterpreted or heard as noise respectively.

However, it is also known that the level of noise believed undesirable to the human ear is subjectively ascertainable while the level of noise which destroys the quality of a data signal is objectively determinable. The two levels are likely different in a particular application, thus the requirement for two squelch circuits responsive to two different levels of noise.

Similarly, one should not infer from FIG. 1 that squelch circuit 120 and 121 must be placed in the output paths 117 and 119 respectively. They may, for example, be located anywhere on the voice or data paths such as in paths 118, 133, or 134. Alternatively, they may act to attenuate the levels of voice and data to abort transmission of either signal, or to cut off power to any elements requiring power in the voice or data paths.

At the same time the non-integrated indicator signal is provided to integrator 360, it is provided through low pass filter 370 to amplifier 395 and to speaker 320. If the noise level is undesirably high, it is useful to provide an audible indication of the noise to the user of transmitter 1. In this manner the user is encouraged to reorient the transmitter 1 or to move closer to the receiver 110.

Figure 2:
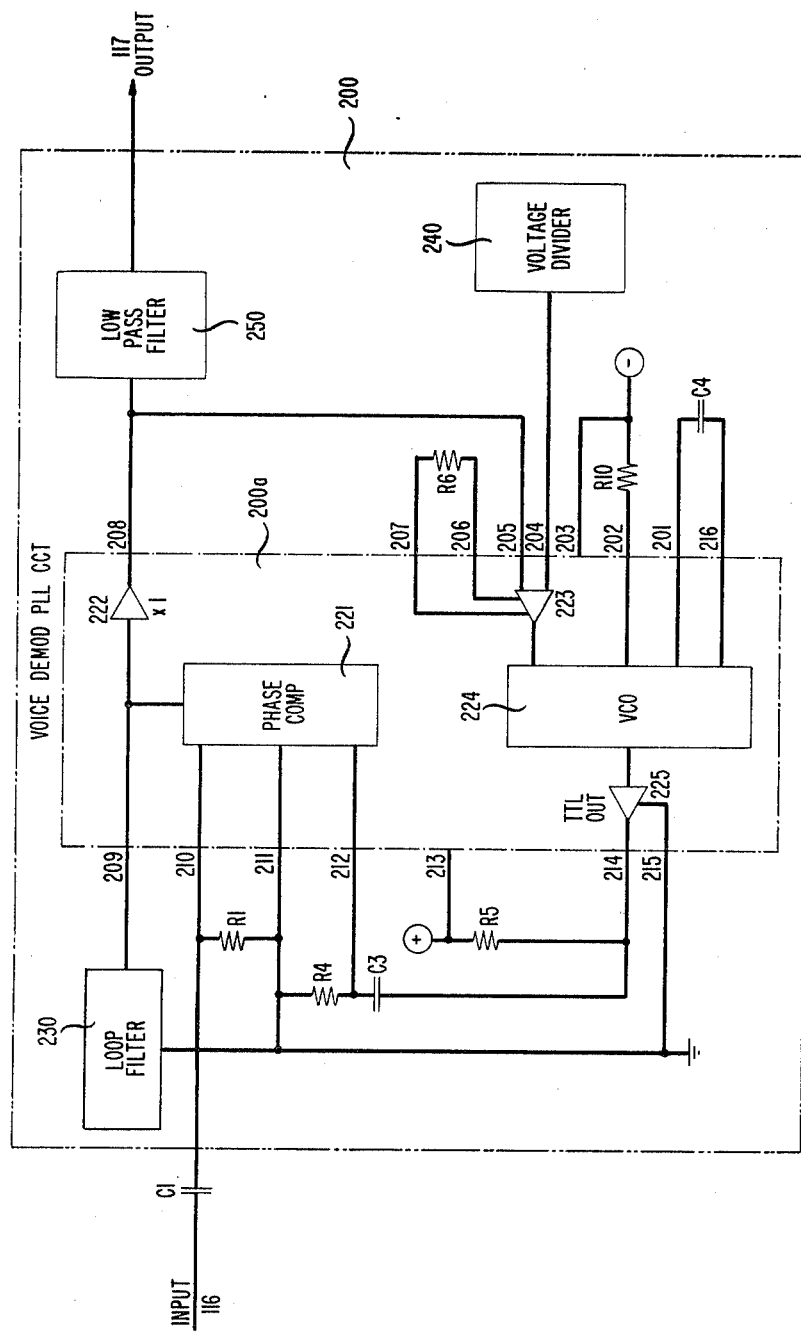
FIG. 2 is a detailed schematic drawing of one embodiment of the phaselock loop circuit of FIG. 1 for extracting a voice signal from the received signal.

Referring to FIG. 2, there is shown a detailed schematic drawing of one embodiment of the phaselock loop circuit of FIG. 1 for extracting a voice signal from the received signal. Phaselock loop circuit 200 may, for example, comprise a Western Electric Company 502 EP integrated circuit chip 200a having input terminals 1–16 denoted, for convenience, terminals 201–216. Negative direct current potential is provided at terminal 203, positive potential at terminal 213, and ground at terminal 211.

The received input signal is provided at terminal 210 to phase comparator circuit 221 for comparing the phase relationships of the input signal and a feedback signal through coupling capacitor C3 at ground referenced terminals 211 and 212. Resistors R1 and R4 provide the ground referencing function.

Loop filter 230 is connected at terminal 209 to the output of phase comparator 221. The loop filter 230 should be particularly selected in accordance with the voice demodulation function performed by phase comparator circuit 221. The loop natural frequency and loop bandwidth in the depicted embodiment are equal at approximately 6.8 kHz. A second order lead-lag filter may be employed for loop filter 230 in the depicted embodiment.

The demodulated voice output, buffered by amplifier multiplier circuit 222, is provided at output terminal 208. The voice output signal is simultaneously provided to the input of low pass filter 250 and to input terminal 205 of amplifier 223.

Gain determining resistor R6 is chosen in accordance with the desired gain of amplifier 223 and is connected at output terminals 206 and 207. The choice of gain resistor R6 and of the characteristics of loop filter 230 determine the gain of the voice demodulator PLL circuit 200. A reference voltage is provided at terminal 204 to the amplifier 223 which is firmly established by voltage divider circuit 240.

The output of amplifier 223 is provided to the input of voltage controlled oscillator circuit 224. Frequency determining resistor R10 and capacitor C4 Frequency determining resistor R10 and capacitor C4 establish the output of the voltage controlled oscillator 224 at 120 kHz, the selected carrier frequency. The carrier output is fedback through TTL output amplifier circuit 225 as previously described.

Figure 3:
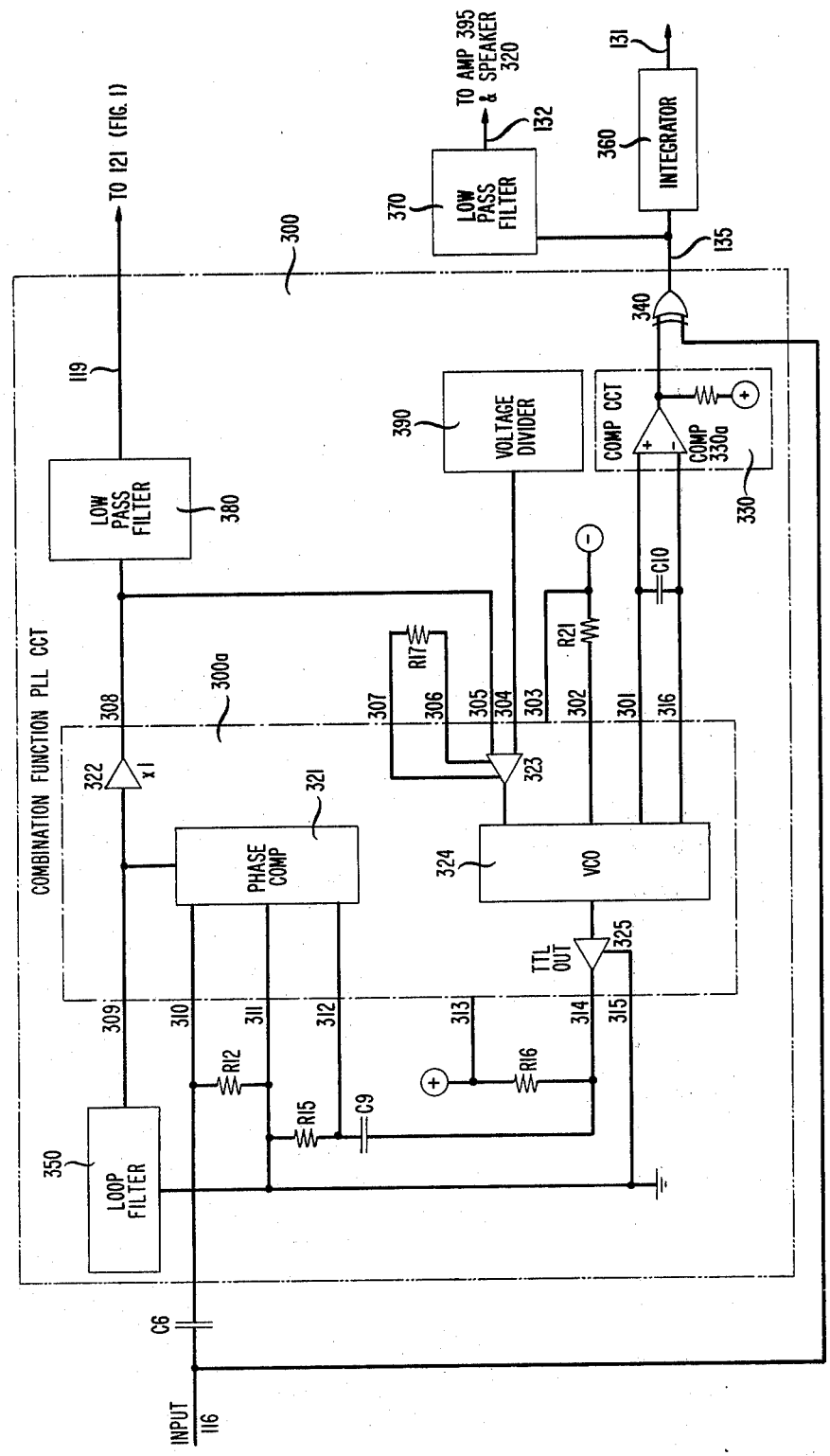
FIG. 3 is a detailed schematic drawing of one embodiment of the combination function phaselock loop circuit of FIG. 1 for providing a noise level indicator signal and a once demodulated digital data signal.

Referring to FIG. 3, there is shown a detailed schematic drawing of one embodiment of the combination function phaselock loop circuit of FIG. 1. The combination function phaselock loop circuit provides three outputs: a once demodulated data output on lead 119, an indicator signal on lead 131 representative of the noise level of the received signal, and a noise signal on lead 132 for providing an audible feedback of a noisy transmission path to the user of the system.

In the depicted embodiment, phaselock loop circuit 300a represents a Western Electric 502 EP integrated circuit chip; however, other phaselock loop circuits known in the art may be employed. Its operation is identical to the operation of voice demodulator phaselock loop 200. With the exception of the choice of component values for loop filter 350 and gain determining resistor R17, the values of the resistor and capacitor elements comprising the feedback path and the values of the frequency determining resistor and the timing capacitor may be identical.

Loop filter 350, on the other hand, is considerably different from loop filter 230. The bandwidth of the phaselock loop circuit 300 is chosen to exceed the bandwidth of loop filter 230 of phaselock loop circuit 200. In the particular depicted embodiment, the bandwidth is four times greater or 27 kHz. One reason for the larger bandwidth is to provide a better indication of the noise. The larger bandwidth admits more noise but acting in combination with the previously described tracking characteristics of a phaselock loop accomplishes an overall noise reduction. Also, since the FSK data is modulated above the voice at alternating frequencies of 5 and 6.25 kHz, the larger bandwidth readily admits the FSK modulated input.

The characteristics of low pass filter 380 permit the frequency shift keyed output to pass. The filter also eliminates carrier frequency ripple and any carrier harmonics. Gain determining resistor R17 for amplifier 323 is chosen so as to provide a sufficient FSK signal at output lead 119.

The noise indicating feature of the present invention relates to the frequency determining or timing capacitor C10, the high speed comparator amplifier circuit 330 and the exclusive OR circuit 340. Low pass filter 370 and integrator circuit 360, responsive to the indicator signal output of exclusive OR circuit 340, provide a noise proportional signal for speaker feedback to the user and an integrated signal for operation of squelch circuits 120 and 121 respectively.

In conventional operation of a phaselock loop, the output of the voltage-controlled oscillator 324 is 90 degrees ahead of the input signal on lead 116 and at the same frequency. To obtain a signal in phase with the input signal, the phase of the output of voltage controlled oscillator 324 must be advanced 90 degrees before it is applied to one input of exclusive OR circuit 340. Phase shifting is accomplished by the application of the high speed comparator circuit 330. In the particular application depicted, a National Semiconductor LM319 amplifier is employed for comparator 330.

Figure 5:
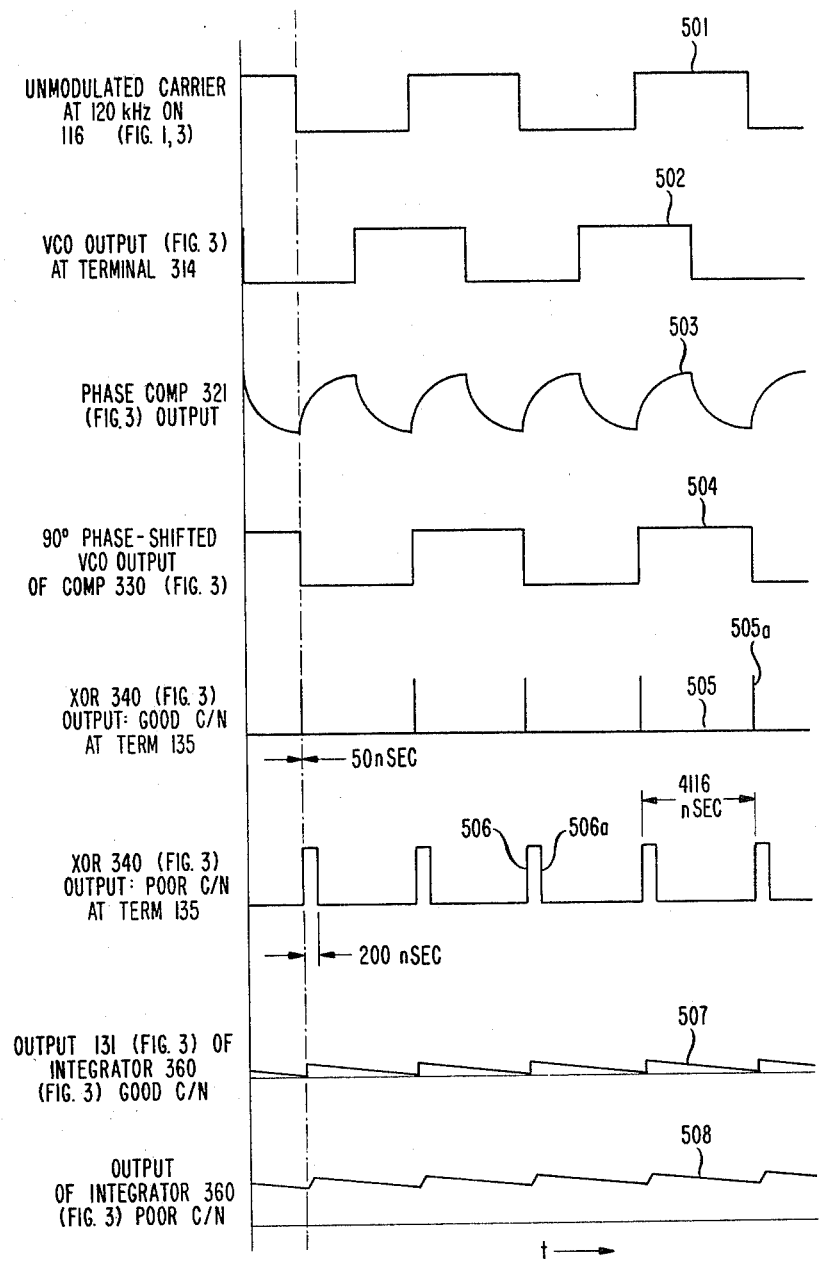
FIG. 5 is a graphical representation of typical waveforms found at various points in the combination function phaselock loop circuit of FIG. 3.

Referring to FIG. 5, there are shown typical waveforms at various points in phaselock loop circuit 300. Waveform 501 represents the unmodulated carrier input at 120 kHz on lead 116. Waveform 502 represents the output of voltage controlled oscillator 324, 90 degrees ahead of waveform 501, measured at the output of TTL amplifier 325. Waveform 503 represents the output of phase comparator 321 which compares the phase relationships of waveforms 501 and 502. Waveform 503 resembles a smoothed squarewave at twice the carrier frequency. The phase comparator output wave 503, after passage through low pass filter 250, becomes a frequency shift keyed output signal at lead 119.

It is especially important to provide a phase shifted waveform 504 which is as delay-free as possible for comparison with waveform 501 at exclusive OR circuit 340. Such a delay-free signal is provided by comparator circuit 330. The comparator amplifier provides a 90 degree phase shifted output waveform 504 derived off timing capacitor C10. Waveforms similar to 505 or 506 or time-dependent variations thereof are provided at the output of exclusive OR circuit 340 after the exclusive OR function is performed on waveforms 504 and 501.

If the noise is small in comparison with the phaselocking capabilities of the phaselock loop 300 and the received signal is strong, then a good carrier-to-noise ratio exists and the output waveform 505 may appear to be a periodic pulse 505a having very narrow width on the order of 50 nanoseconds. On the other hand, if the carrier-to-noise ratio is poor, periodic pulses 506a exhibit themselves as waveform 506 having widths on the order of 200 nanoseconds.

If the noise comprises white noise or phase jitter of relatively uniform distribution, the noise causes time dependent variations of the pulse widths. If the noise is of the discontinuous type, as for example, impulse or phase hits the pulse widths vary considerably. Also, if the phaselock loop is unable to track the input signal and the carrier-to-noise ratio is very poor, a phenomenon known as cycle-skipping occurs and the pulse widths discontinuously appear as wide pulses.

Upon passage of waveforms 505 and 506 through integrator circuit 360, the magnitudes of the resulting waveforms 507 and 508 are proportional to the pulse widths 505a and 506a. Accordingly, in the event of a good carrier-to-noise ratio, hardly any output signal 507 results. In the event of a poor carrier-to-noise ratio, output waveform 508 represents a noise indicator signal of considerable magnitude for operation of squelch circuits 120 and 121.

The waveforms resulting from the passage of waveforms 505 and 506 through low pass filter 370 are not shown. However, it is known in the art that the integration function performed by integrator 360 is similar in nature to the filtering function performed by low pass filter 370. Accordingly, it may be assumed that a noise signal waveform is available at the output of filter 370 for subsequent provision to speaker 320.

Figure 4:
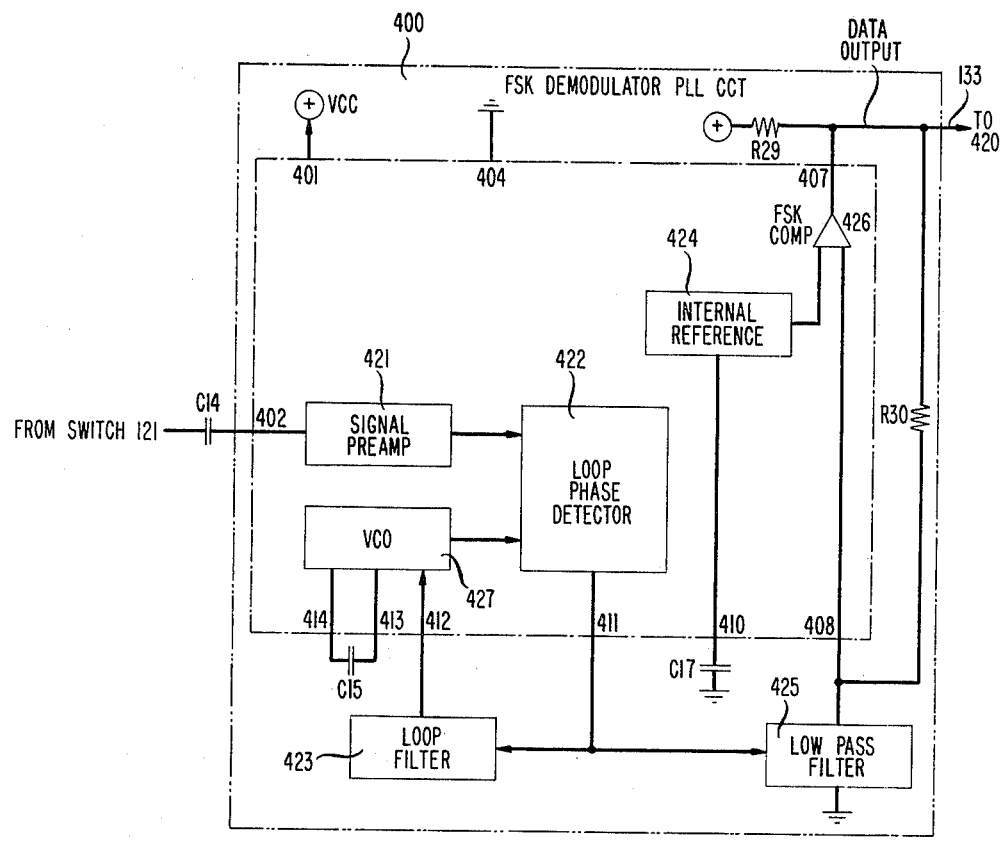
FIG. 4 is a detailed schematic drawing of one embodiment of a phaselock loop circuit of FIG. 1 for extracting the digital data signal from the once demodulated signal output of the combination function phaselock loop circuit.

Referring to FIG. 4, there is shown a detailed schematic drawing of data demodulator phaselock loop circuit 400. In the depicted embodiment, an EXAR Integrated System XR-2211 phaselock loop integrated circuit 400a provides FSK demodulation and tone decoding of the frequency shift keyed input signal on lead 119. Another form of phaselock loop should be applied if another form of data modulation is employed. Terminals 1–14 of the phaselock loop circuit 400a are conveniently numbered 400–414.

The operation of phaselock loop circuit 400 is now briefly described. The FSK input signal at lead 119 is passed through signal preamplifier circuit 421 and provided at one input of loop phase detector 422. The output of loop phase detector 422 is provided through loop filter 423 to drive voltage controlled oscillator 427. The output of voltage controlled oscillator 427 is phase compared with the amplified output of signal preamplifier circuit 421.

The output of loop phase detector 422 is provided through low pass filter 425 for comparison with a voltage from internal reference source 424 at FSK comparator amplifier 426. Accordingly, the resulting output waveform at terminal 407 is a binary data stream. In order to prevent chatter, a feedback resistor R30 is provided to positively feedback the data output at lead 133 to the input to FSK comparator amplifier 426 at terminal 408.

What is claimed is:
1. In a frequency modulated signal receiver, a noise detector and signal receiver
characterized by
a phaselock loop circuit (300) responsive to the received signal, the phaselock loop circuit for providing a first output signal (505, 506) representative of the carrier-to-noise ratio of the received signal and for providing a second output signal representing a demodulated received signal,
the phaselock loop circuit comprising a phaselock loop, a comparator amplifier (330) and an exclusive

OR gate (340) connected in series configuration, the exclusive OR gate being responsive to the comparator amplifier and the comparator amplifier being responsive to the phaselock loop.

2. In a frequency modulated signal receiver, a noise detector and signal receiver
characterized by
a phaselock loop circuit (300) responsive to the received signal, the phaselock loop circuit for providing a first output signal (505, 506) representative of the carrier-to-noise ratio of the received signal and for providing a second output signal representing a frequency shift key modulated data signal,
the phaselock loop circuit comprising a phaselock loop, a comparator amplifier (330) and an exclusive OR gate (340) connected in series configuration, the comparator amplifier being connected between the phaselock loop and the exclusive OR gate, the exclusive OR gate providing the first output signal and the phaselock loop providing the second output signal.

3. A frequency modulated signal receiver
characterized by
a noise detector circuit (300) comprising
a phaselock loop (300a), responsive to the received signal, having a timing capacitor (C10),
a comparator amplifier (330) connected across the timing capacitor, and
an exclusive OR gate (340), responsive to the received signal and the output of the comparator amplifier, for providing a signal (505, 506) representative of the carrier-to-noise ratio of the received signal.

4. A frequency modulated signal receiver as recited in claim 3
further characterized by
a second phaselock loop (200), responsive to the received signal, for demodulating the received signal, and
squelch circuit (120), responsive to the output of the noise detector circuit, for disabling the output of the second phaselock loop if the carrier-to-noise ratio falls below a particular level.

5. In a frequency modulated signal receiver, a noise detector and signal receiver
characterized by
a phaselock loop circuit (300), responsive to the received signal, for providing a first output signal (505, 506) representative of the carrier-to-noise ratio of the received signal and for providing a second output signal representing a demodulated received signal, the phaselock loop circuit comprising
a phaselock loop (300a) having a timing capacitor (C10),
a comparator amplifier (330) connected across the timing capacitor (C10), and
an exclusive OR gate (340), responsive to the received signal and the output of the comparator amplifier (330), for providing the first output signal (505, 506).

6. In a frequency modulated signal receiver, a noise detector and signal receiver
characterized by
a phaselock loop circuit (300), responsive to the received signal, for providing a first output signal (505, 506) representative of the carrier-to-noise ratio of the received signal and for providing a second output signal representing a frequency shift key modulated data signal, the phaselock loop circuit comprising
a phaselock loop (300a) having a timing capacitor (C10),
a comparator amplifier (330), connected across the timing capacitor, and
an exclusive OR gate (340), responsive to the received signal and the output of the comparator amplifier (330).

7. A noise detector and signal receiver as recited in claim 5 or 6
further characterized by
a second phaselock loop (400), responsive to the second output signal of the phaselock loop circuit (300), for providing a demodulated digital data signal.

8. A noise detector and signal receiver
characterized by
a first phaselock loop circuit (300), responsive to the received signal, for providing a first output signal (505, 506) representative of the carrier-to-noise ratio of the received signal and for providing a second output signal representing a demodulated received signal, the first phaselock loop circuit comprising:
A. a phaselock loop (300a) having a timing capacitor (C10),
B. a comparator amplifier (330), connected across the timing capacitor (C10), and
C. an exclusive OR gate (340), responsive to the received signal and the output of the comparator amplifier (330),
a second phaselock loop circuit (400), responsive to the second output signal of the phaselock loop circuit (300), for providing a demodulated digital data signal, and
a third phaselock loop circuit (200), responsive to the received signal, for providing a third output signal from the received signal.

9. A noise detector and signal receiver as recited in claim 8
further characterized by
a squelch circuit (120 or 121), responsive to the first output signal (505, 506) of the first phaselock loop circuit (300), for disabling the demodulated digital data signal or the third output signal if the carrier-to-noise ratio falls below a particular level.

10. In a system using frequency modulated carrier transmission between a portable transmitter and a receiver, a noise detector and signal receiver
characterized by
a first phaselock loop circuit (300) responsive to the received signal, the first phaselock loop circuit for providing an indicator signal (505, 506) representative of the received signal's carrier-to-noise ratio and for providing a demodulated output signal, the received signal having undergone a first stage of demodulation,
a second phaselock loop (400), responsive to the demodulated output signal of the first phaselock loop circuit (300), the second phaselock loop for extracting a first signal from the received signal, and
a third phaselock loop (200) responsive to the received signal, the third phaselock loop for extracting a second signal from the received signal.

11. A noise detector and signal receiver as recited in claim 10 further characterized by gating means (120 or 121), responsive to the indicator signal output of the first phaselock loop circuit (300), for disabling the first or second signal if the carrier-to-noise ratio falls below a particular level.

12. A noise detector and signal receiver as recited in claim 10 further characterized by a first squelch circuit (121) responsive to a particular level of indicator signal output of the first phaselock loop circuit (300), for disabling the first signal and a second squelch circuit (120), responsive to a second particular level of indicator signal output of the first phaselock loop (300), for disabling the second signal.

13. A noise detector and signal receiver characterized by a first squelch circuit (121) responsive to a first particular level of indicator signal output of a phaselock loop circuit (300), the indicator signal output level being representative of the carrier-to-noise ratio of a signal received by the phaselock loop circuit (300), and a second squelch circuit (120) responsive to a second particular level of indicator signal output of the phaselock loop circuit (300), the first and second squelch circuits squelching different information carrying signal components of the received signal.

* * * * *